(12) United States Patent
Shin et al.

(10) Patent No.: US 7,839,190 B2
(45) Date of Patent: Nov. 23, 2010

(54) LOCKING STATE DETECTOR AND DLL CIRCUIT HAVING THE SAME

(75) Inventors: Dong-Suk Shin, Ichon (KR); Chul Woo Kim, Ichon (KR); Hyun Soo Chae, Ichon (KR)

(73) Assignees: Hynix Semiconductor Inc. (KR); Korea University Industrial & Academic Collaboration Foundation (KR)

( * ) Notice: Subject to any disclaimer, the term of this patent is extended or adjusted under 35 U.S.C. 154(b) by 0 days.

(21) Appl. No.: 12/263,300

(22) Filed: Oct. 31, 2008

(65) Prior Publication Data

US 2009/0206884 A1    Aug. 20, 2009

(30) Foreign Application Priority Data

Feb. 14, 2008   (KR) .................. 10-2008-0013466

(51) Int. Cl.
   *H03L 7/06*   (2006.01)
(52) U.S. Cl. .................... 327/158; 327/149
(58) Field of Classification Search ............. 375/373, 375/376; 327/149, 158
   See application file for complete search history.

(56) References Cited

U.S. PATENT DOCUMENTS

| 6,496,554 | B1* | 12/2002 | Ahn .................. 375/376 |
| 6,876,240 | B2 | 4/2005 | Moon et al. |
| 7,236,028 | B1 | 6/2007 | Choi |
| 7,339,408 | B2 | 3/2008 | Lee |
| 7,480,361 | B1* | 1/2009 | Zhang et al. .......... 375/376 |
| 2002/0109495 | A1* | 8/2002 | Antone et al. ......... 324/76.54 |
| 2002/0175769 | A1* | 11/2002 | Wong et al. ............ 331/17 |

FOREIGN PATENT DOCUMENTS

| JP | 2003-258632 | 9/2003 |
| JP | 2003-258632 A | 9/2003 |
| KR | 1020050089475 A | 9/2005 |
| KR | 10200570091038 | 9/2005 |
| KR | 10200570091038 A | 9/2005 |

* cited by examiner

*Primary Examiner*—Lincoln Donovan
*Assistant Examiner*—Adam D Houston
(74) *Attorney, Agent, or Firm*—Baker & McKenzie LLP

(57) ABSTRACT

A locking state detector includes a phase comparing unit configured to compare a reference clock signal and a feedback clock signal to generate a first phase difference distinction signal to distinguish a first phase difference range, and a second phase difference distinction signal to distinguish a second phase difference range wider than the first phase difference range, and a locking state setting unit configured to generate a locking state signal in response to the first phase difference distinction signal and the second phase difference distinction signal.

12 Claims, 4 Drawing Sheets

LOCKING STATE DETECTOR AND DLL CIRCUIT HAVING THE SAME

CROSS-REFERENCES TO RELATED PATENT APPLICATION

The present application claims priority under 35 U.S.C 119(a) to Korean Application No. 10-2008-0013466, filed on Feb. 14, 2008, in the Korean Intellectual Property Office, which is incorporated herein by reference in its entirety as if set forth in full.

BACKGROUND

1. Technical Field

The embodiments described herein relate to a delay locked loop circuit (DLL circuit), and in particular, to a locking state detector that detects the locking state and a DLL circuit including the same.

2. Related Art

Generally, a DLL circuit is used to provide an internal clock signal whose phase is faster than that of a reference clock signal, and is obtained by converting an external clock signal by a predetermined time period. Specifically, the DLL circuit is used to solve the problem of prolonged output data access time, wherein the internal clock signal used in a semiconductor circuit is delayed while passing through a clock buffer and along a transmission line causing a phase difference from the external clock signal. The DLL circuit controls the phase of the internal clock signal to be faster than the phase of the external clock signal by a predetermined time in order to increase the effective data output interval.

The DLL circuit is commonly arranged having a feedback loop configuration, and includes a delay line that delays a reference clock signal transmitted from a clock input buffer in response to a delay control signal to generate a delay clock signal, a replica delayer that delays the delay clock signal with a delay value that is obtained by modeling a delay amount by delay elements presented in the output path of the delay clock signal to generate the feedback clock signal, a phase detecting block that compares and detects phases of the reference clock signal and the feedback clock signal to generate a phase detecting signal, and a delay controlling block that generates a delay control signal in response to the phase detecting signal.

In addition, the DLL circuit further includes a locking state detector that enables a locking state signal, which indicates the completion of the delay locking operation when the phase difference between the reference clock signal and the feedback clock signal is reduced below a predetermined range. If the locking state signal is enabled, then the delay controlling block adjusts the number of unit delays activated in the delay line to stop the changing of the delay value.

Generally, the external clock signal that is input to the DLL circuit includes a jitter component, that effects the toggle timing or the pulse width of the external clock signal. If the jitter is generated in the external clock signal it can cause the phase of the reference clock to change. When this occurs, the phase difference between the reference clock signal and the feedback clock signal instantaneously exceeds the predetermined range. The locking state detector is configured to disable the locking state signal whenever the above phenomenon occurs. Therefore, the enable state of the locking state signal is frequently changed by the jitter of the external clock signal, which causes the DLL circuit to, e.g., frequently change of the operation mode. As a result, the internal clock signal cannot be stably generated. Furthermore, because the stability of the operation of the DLL circuit is reduced, a semiconductor integrated circuit (IC) that uses the DLL circuit is not suitable for stable operation.

SUMMARY

A locking state detector that supports stable operation of a semiconductor IC and a DLL circuit having a locking state detector are described herein.

In one aspect, a locking state detector includes a phase comparing unit configured to compare a reference clock signal and a feedback clock signal to generate a first phase difference distinction signal to distinguish a first phase difference range, and a second phase difference distinction signal to distinguish a second phase difference range wider than the first phase difference range, and a locking state setting unit configured to generate a locking state signal in response to the first phase difference distinction signal and the second phase difference distinction signal.

In another aspect, a DLL circuit includes a phase detecting block configured to compare and detect phases of a reference clock signal and a feedback clock signal to generate a phase detection signal, a locking state detector configured to enable a locking state signal when the phase difference between the reference clock signal and the feedback clock signal is below a first phase difference range, and to disable the locking state signal only when the phase difference between the reference clock signal and the feedback clock signal exceeds a second phase difference range that is wider than the first phase difference range, a delay controlling block configured to generate a delay control signal in response to the phase detection signal and the locking state signal, and a delay line configured to delay the reference clock signal in response to the delay control signal to generate a delay clock signal.

These and other features, aspects, and embodiments are described below in the section "Detailed Description."

BRIEF DESCRIPTION OF THE DRAWINGS

Features, aspects, and embodiments are described in conjunction with the attached drawings, in which.

DETAILED DESCRIPTION

Figure 1:
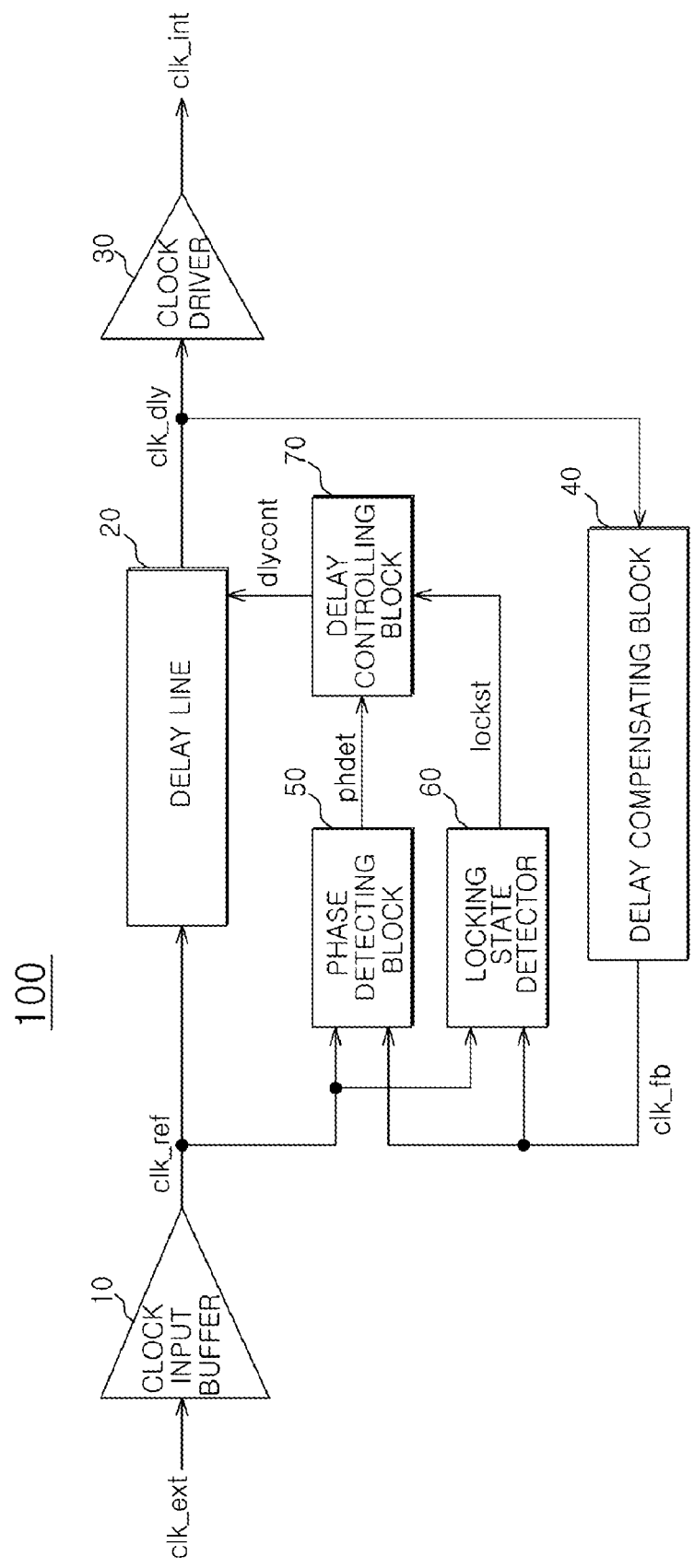
FIG. 1 is a schematic block diagram of an exemplary DLL circuit according to one embodiment.

FIG. 1 is a schematic block diagram of an exemplary DLL circuit according to one embodiment. As shown in FIG. 1, the DLL circuit 100 can include a clock input buffer 10, a delay line 20, a clock driver 30, a delay compensating block 40, a phase detecting block 50, a locking state detector 60, and a delay controlling block 70.

The clock input buffer 10 can buffer an external clock signal 'clk_ext' to generate a reference clock signal 'clk_ref.' The delay line 20 can delay the reference clock signal 'clk_ref' in response to a delay control signal 'dlycont' to generate a delay clock signal 'clk_dly'. The clock driver 30 can drive the delay clock signal 'clk_dly' to output an internal clock signal 'clk_int'. The delay compensating block 40 can apply a delay time obtainable by modeling the delay presented in an output path of the delay clock signal 'clk_dly' to the delay clock signal 'clk_dly' to generate a feedback clock signal 'clk_fb'. The phase detecting block 50 can compare and detect phases of the reference clock signal 'clk_ref' and the feedback clock signal 'clk_fb' to generate a phase detection signal 'phdet'. The locking state detector 60 can compare the phases of the reference clock signal 'clk_ref' and the feedback clock signal 'clk_fb' to generate a locking state signal 'lockst'. The delay controlling block 70 can generate a delay control signal 'dlycont' in response to the phase detection signal 'phdet' and the locking state signal 'lockst'.

At an initial stage of operation of the DLL circuit 100, when the locking state signal 'lockst' is disabled, the delay controlling block 70 can change a logical value of the delay control signal 'dlycont', which can be provided as a plurality of digital signals, in response to the phase detection signal 'phdet' to control the delay applied by the delay line 20 to the reference clock signal 'clk_ref'. Accordingly, the delay line 20 can include a plurality of unit delays and can control the phase of the delay clock signal 'clk_dly' by adding or subtracting the number of unit delays to be activated.

Thereafter, if the phase difference between the reference clock signal 'clk_ref' and the feedback clock signal 'clk_fb' is decreased below a first phase difference range, for example, the locking state detector 60 can enable the locking state signal 'lockst'. When the locking state signal 'lockst' is enabled, the delay controlling block 70 can lock the logical value of the delay control signal 'dlycont' to prevent the delay line 20 from further changing the number of unit delays to be activated.

Even when the phase difference between the reference clock signal 'clk_ref' and the feedback clock signal 'clk_fb' exceeds the first phase difference range, the locking state detector 60 can disable the locking state signal 'lockst'. However, according to the embodiments described herein, when the locking state signal 'lockst' is enabled, as described above, the locking state detector 60 can disable the locking state signal 'lockst' when the phase difference between the reference clock signal 'clk_ref' and the feedback clock signal 'clk_fb' exceeds a second phase difference range that can be wider than the first phase difference range. Accordingly, even though a toggle timing or a pulse width of the external clock signal 'clk_ext' can be instantaneously reduced, the DLL circuit 100 can perform stable operation because the enable state of the locking state signal 'lockst' is maintained.

Figure 2:
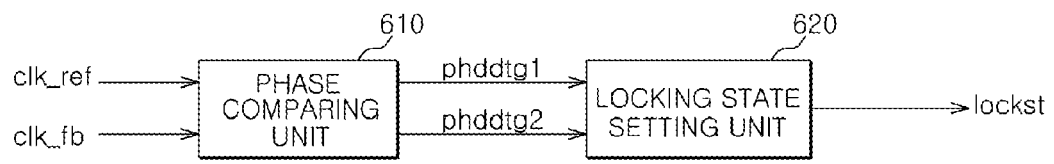
FIG. 2 is a schematic block diagram of an exemplary locking state detector that can be included in the circuit of FIG. 1 according to the one embodiment.

FIG. 2 is a schematic block diagram of an exemplary locking state detector of FIG. 1 according to the one embodiment. As described in FIG. 2, the locking state detector 60 can include a phase comparing unit 610 and a locking state setting unit 620.

The phase comparing unit 610 can compare phases of the reference clock signal 'clk_ref' and the feedback clock signal 'clk_fb' to generate a first phase difference distinction signal 'phddtg1' and a second phase difference distinction signal 'phddtg2'. The locking state setting unit 620 can generate the locking state signal 'lockst' in response to the first phase difference distinction signal 'phddtg1' and the second phase difference distinction signal 'phddtg2'.

The first phase difference distinction signal 'phddtg1' can be generated when the first phase difference range is detected. For example, the phase comparing unit 610 can enable the first phase difference distinction signal 'phddtg1' when the phase difference between the reference clock signal 'clk_ref' and the feedback clock signal 'clk_fb' is reduced below the first phase difference range.

The second phase difference distinction signal 'phddtg2' can be generated by detecting the second phase difference range. For example, when the phase difference between the reference clock signal 'clk_ref' and the feedback clock signal 'clk_fb' is reduced below the second phase difference range, the phase comparing unit 610 can enable the first phase difference distinction signal 'phddtg1'. Since the first phase difference range can be narrower than the second phase difference range, when the first phase difference distinction signal 'phddtg1' is enabled, the second phase difference distinction signal 'phddtg2' can be continuously enabled.

The locking state setting unit 620 can enable the locking state signal 'lockst' when the first phase difference distinction signal 'phddtg1' and the second phase difference distinction signal 'phddtg2' are enabled at the initial stage of the operation of the DLL circuit 100. Thereafter, even though the first phase difference distinction signal 'phddtg1' can be disabled, as long as the second phase difference distinction signal 'phddtg2' is maintained as enabled, the enabled state of the locking state signal 'lockst' can be maintained. Conversely, when the second phase difference distinction signal 'phddtg2' is disabled, the locking state setting unit 620 can disable the locking state signal 'lockst'.

As an example, when only the first phase difference distinction signal 'phddtg1' is disabled, the external clock signal 'clk_ext' can instantaneously include a jitter component. Therefore, the enabled state of the locking state signal 'lockst' can be maintained, which prevents a malfunctioning operation of the DLL circuit 100. Conversely, when the second phase difference distinction signal 'phddtg2' is disabled, the phases of the reference clock signal 'clk_ref' and the feedback clock signal 'clk_fb' can be reset so that the phase difference between the reference clock signal 'clk_ref' and the feedback clock signal 'clk_fb' may increase. Accordingly, the locking state can be released to cause the DLL circuit 100 to perform the same operation when the locking state is not set.

Figure 3:
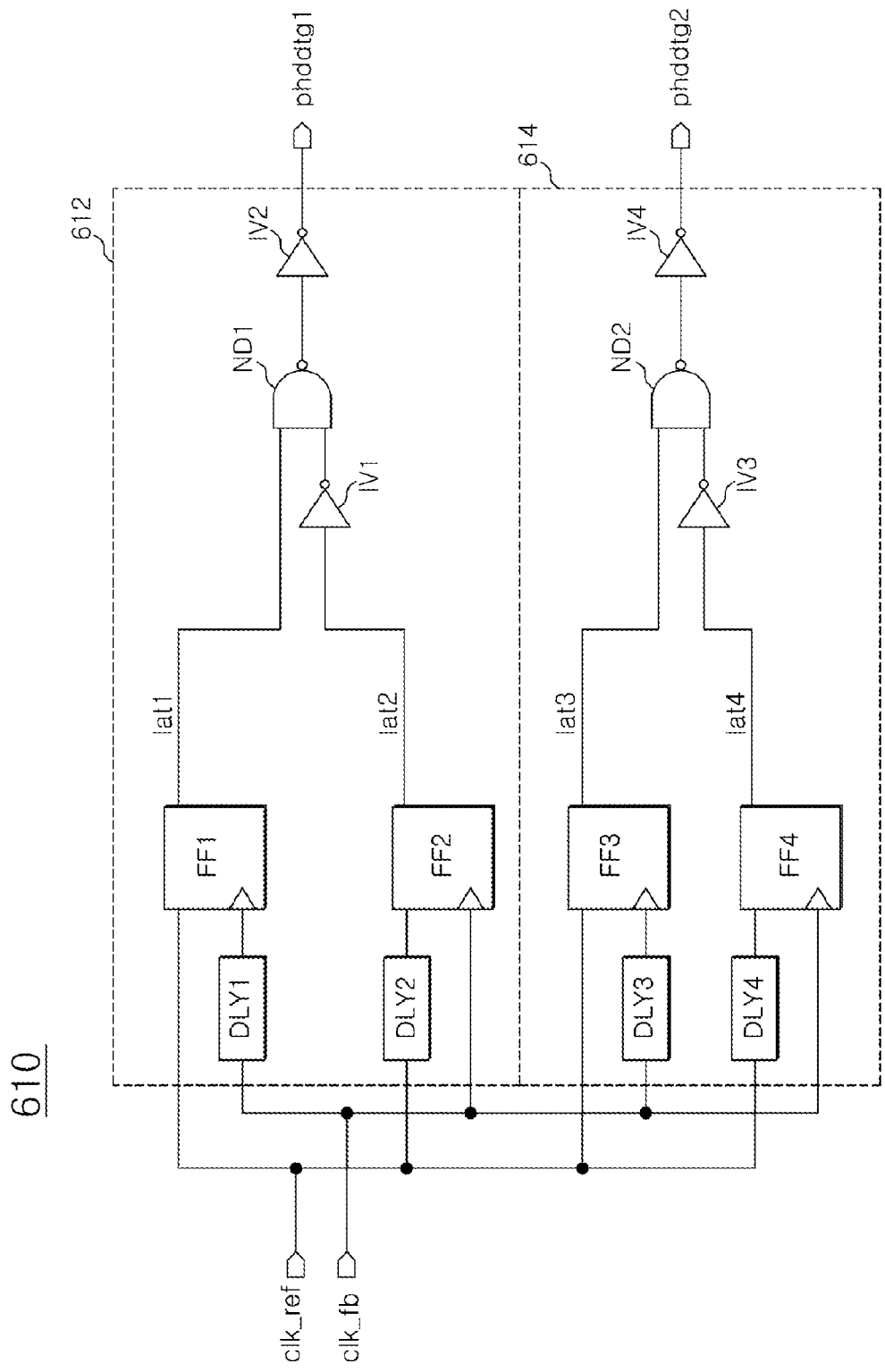
FIG. 3 is a schematic block diagram of an exemplary phase comparing unit that can be included in the state detector of FIG. 2 according to the one embodiment.

FIG. 3 is a schematic block diagram of an exemplary phase comparing unit of FIG. 2 according to the one embodiment. As shown in FIG. 3, the phase comparing unit 610 can include a first discriminating section 612 and a second discriminating section 614.

The first discriminating section 612 can discriminate whether the phase difference between the reference clock signal 'clk_ref' and the feedback clock signal 'clk_fb' is below the first phase difference range to generate the first phase difference distinction signal 'phddtg1'. The first discriminating section 612 can be configured to include a first delay unit DLY1, a second delay unit DLY2, a first flip-flop FF1, a second flip-flop FF2, a first inverter IV1, a second inverter IV2, and a first NAND gate ND1.

The first delay unit DLY1 can delay the feedback clock signal 'clk_fb' by a first time. The first flip-flop FF1 can latch the reference clock signal 'clk_ref' in response to an output signal of the first delay unit DLY1 to output a first latch signal 'lat1'. The second delay unit DLY2 can delay the reference clock signal 'clk_ref' by the first time. The second flip-flop FF2 can latch an output signal of the second delay unit DLY2 in response to the feedback clock signal 'clk_fb' to output a second latch signal 'lat2'. The first inverter IV1 can be configured to receive the second latch signal 'lat2'. The first NAND gate ND1 can be configured to receive the first latch signal 'lat1' and an output signal of the first inverter 'IV1'. The second inverter IV2 can be configured to receive an output signal of the first NAND signal ND1 to output the first phase difference distinction signal 'phddtg1'.

The second discriminating section 614 can discriminate whether the phase difference between the reference clock signal 'clk_ref' and the feedback clock signal 'clk_fb' is below the second phase difference range to generate the second phase difference distinction signal 'phddtg2'. The second discriminating section 614 can be configured to include a third delay unit DLY3, a fourth delay unit DLY4, a third flip-flop FF3, a fourth flip-flop FF4, a third inverter IV3, a fourth inverter IV4, and a second NAND gate ND2.

The third delay unit DLY3 can delay the feedback clock signal 'clk_fb' by a second time period. The third flip-flop FF3 can latch the reference clock signal 'clk_ref' in response to an output signal of the third delay unit DLY3 to output a third latch signal 'lat3'. The fourth delay unit DLY4 can delay the reference clock signal 'clk_ref' by the second time period. The fourth flip-flop FF4 can latch an output signal of the fourth delay unit DLY4 in response to the feedback clock signal 'clk_fb' to output a fourth latch signal 'lat4'. The third inverter IV3 can be configured to receive the fourth latch signal 'lat4'. The second NAND gate ND2 can be configured to receive the third latch signal 'lat3' and an output signal of the third inverter 'IV3'. The fourth inverter IV4 can be configured to receive an output signal of the second NAND signal 'ND2' to output the second phase difference distinction signal 'phddtg2'.

The first time period can correspond to one-half the first phase difference range, and the second time period can correspond to one-half the second phase difference range. Therefore, the second time period can be longer than the first time period.

The first phase difference distinction signal 'phddtg1' can be enabled only when the voltage level of the first latch signal 'lat1' is substantially at a high level and the voltage level of the second latch signal 'lat2' is substantially at a low level. Further, the second phase difference distinction signal 'phddtg2' can be enabled only when the voltage level of the third latch signal 'lat3' is substantially at a high level and the voltage level of the fourth latch signal 'lat4' is substantially at a low level. With this exemplary configuration, when the phase difference between the reference clock signal 'clk_ref' and the feedback clock signal 'clk_fb' is below the first phase difference range, the first latch signal 'lat1' can transition to a high level and the second latch signal 'lat2' can transition to a low level. Accordingly, the first phase difference distinction signal 'phddtg1' can be enabled. By contrast, when the reference clock signal 'clk_ref' is delayed over the first time period, the first latch 'lat1' can transition to a low level. Thus, the first phase difference distinction signal 'phddtg1' can be disabled. Furthermore, when the feedback clock signal 'clk_fb' is delayed over the first time period, the second latch signal 'lat2' can transition to a high level. Thus, the first phase difference distinction signal 'phddtg1' can be disabled.

When the phase difference between the reference clock signal 'clk_ref' and the feedback clock signal 'clk_fb' is below the second phase difference range, the third latch signal 'lat3' can transition to a high level and the fourth latch signal 'lat4' can transition to a low level. Therefore, the second phase difference distinction signal 'phddtg2' can be enabled. By contrast, when the reference clock signal 'clk_ref' is delayed over the second time period, the third latch signal 'lat3' can transition to a low level. Thus, the second phase difference distinction signal 'phddtg2' can be disabled. Furthermore, when the feedback clock signal 'clk_fb' is delayed over the second time period, the fourth latch signal 'lat4' can transition to a high level. Thus, the second phase difference distinction signal 'phddtg2' can be disabled.

Figure 4:
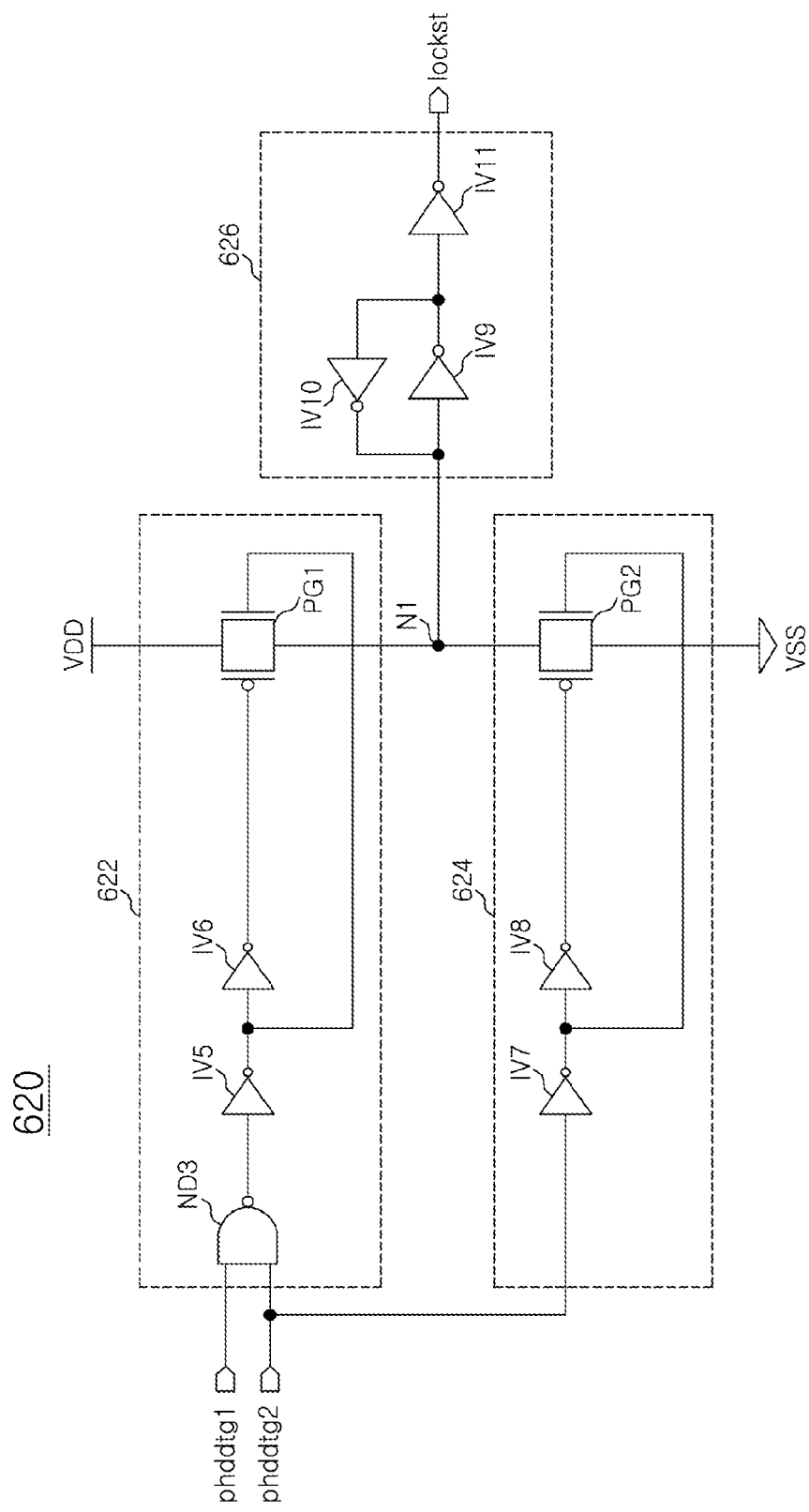
FIG. 4 is a schematic block diagram of an exemplary locking state setting unit that can be included in the state detector of FIG. 2 according to the one embodiment.

FIG. 4 is a schematic block diagram of an exemplary locking state setting unit of FIG. 2 according to the one embodiment. As shown in FIG. 4, the locking state setting unit 620 can be configured to include a first node N1, a pull-up section 622, a pull-down section 624, and a latch section 626.

The pull-up section 622 can pull up the voltage level of the first node N1 in response to the first phase difference distinction signal 'phddtg1' and the second phase difference distinction signal 'phddtg2'. The pull-up section 622 can be configured to include a third NAND gate ND3, a fifth inverter IV5, a sixth inverter IV6, and a first pass gate PG1.

The third NAND gate ND3 can receive the first phase difference distinction signal 'phddtg1' and the second phase difference distinction signal 'phddtg2'. The fifth inverter IV5 can be configured to receive an output signal of the third NAND gate ND3, and the sixth inverter IV6 can be configured to receive an output signal of the fifth inverter IV5. The pass gate PG1 can connect the supply terminal of an external power supply voltage VDD with the first node N1 in response to the output signal of the fifth inverter IV5 and an output signal of the sixth inverter IV6.

The pull-down section 624 can pull down a voltage level of the first node N1 in response to the second phase difference distinction signal 'phddtg2'. The pull-down section 624 can be configured to include a seventh inverter IV7, an eighth inverter IV8, and a second pass gate PG2. The seventh inverter IV7 can receive the second phase difference distinction signal 'phddtg2', and the eighth inverter IV8 can receive an output signal of the seventh inverter IV7. The second pass gate PG2 can connect the ground terminal to the first node N1 in response to the output signal of the seventh inverter IV7 and an output signal of the eighth inverter IV8.

The latch section 626 can latch and drive the voltage of the first node N1 to output the locking state signal 'lockst'. The latch section 626 can be configured to include a ninth inverter IV9, a tenth inverter IV10, and an eleventh inverter IV11. The ninth inverter IV9 can receive the voltage level of the first node N1, and the tenth inverter IV10 can form a latch structure together with the ninth inverter IV9. The eleventh inverter IV11 can receive an output signal of the ninth inverter IV9 to output the locking state signal 'lockst'.

With the exemplary configuration of the locking state setting unit 620, as described above, if both the first phase difference distinction signal 'phddtg1' and the second phase difference distinction signal 'phddtg2' are enabled, then the first pass gate PG1 of the pull-up section 622 can be turned ON. Accordingly, as the second phase difference distinction signal 'phddtg2' is enabled, the second pass gate PG2 of the pull-down section 624 can be turned OFF. Thus, a high level voltage can be supplied to the first node N1, wherein the locking state signal 'lockst' can be enabled to be a high level.

If the first phase difference distinction signal 'phddtg1' is disabled and the second phase difference distinction signal 'phddtg2' is enabled, then the first pass gate PG1 can be turned OFF. The second pass gate PG2 can also be maintained in an OFF state. Accordingly, since the latch section 626 can latch the voltage of the first node N1, the enabled state of the locking state signal 'lockst' can be maintained.

The locking state signal 'lockst' ca be disabled when both the first phase difference distinction signal 'phddtg1' and the second phase difference distinction signal 'phddtg2' are disabled. For example, since the first pass gate PG1 will be turned OFF in such a scenario and the second pass gate PG2 will be turned ON, the voltage level of the first node N1 can be transitioned to a low level. Thus, the locking state signal 'lockst' can be disabled at a low level.

If the phase difference between the reference clock signal 'clk_ref' and the feedback clock signal 'clk_fb' transitions below the first phase difference range at the initial stage of the operation of the DLL circuit 100, then the locking state signal 'lockst' can be enabled. Thereafter, although the waveform of the external clock signal 'clk_ext' slightly changes due to the jitter, the enabled state of the locking state signal 'lockst' can be maintained.

As described above, since the locking state detector according to the embodiments described herein insensitively operates to the external jitter, the locking state can be released only when the phase difference between the reference clock signal and the feedback clock signal is larger than that at the time period of the initial locking state setting, thereby improving operational stability. Furthermore, the DLL circuit 100, which can be configured to include the exemplary locking state detector, can stably operate with respect to the external jitter, thereby supporting a highly efficient semiconductor IC. While certain embodiments have been described above, it will be understood that the embodiments described are by way of example only. Accordingly, the device and method described herein should not be limited based on the described embodiments. Rather, the devices and methods described herein should only be limited in light of the claims that follow when taken in conjunction with the above description and accompanying drawings.

What is claimed is:

1. A locking state detector, comprising:
   a phase comparing unit configured to compare a reference clock signal and a feedback clock signal to generate a first phase difference distinction signal to distinguish a first phase difference range, and a second phase difference distinction signal to distinguish a second phase difference range wider than the first phase difference range; and
   a locking state setting unit configured to generate a locking state signal in response to the first phase difference distinction signal and the second phase difference distinction signal,
   wherein when the first phase difference distinction signal and the second phase difference distinction signal are enabled, the locking state detector is configured to enable the locking state signal, and
   wherein, with the first phase difference distinction signal disabled, when the second phase difference distinction signal is enabled, the locking state detector is configured to maintain the enabled state of the locking state signal.

2. The locking state detector of claim 1, wherein the phase comparing unit includes:
   a first discriminating section configured to distinguish whether the phase difference between the reference clock signal and the feedback clock signal is below the first phase difference range to generate the first phase difference distinction signal; and
   a second discriminating section configured to distinguish whether the phase difference between the reference clock signal and the feedback clock signal is below the second phase difference range to generate the second phase difference distinction signal.

3. The locking state detector of claim 1, wherein the locking state setting unit includes:
   a first node;
   a pull-up section configured to pull up a voltage level of the first node in response to the first phase difference distinction signal and the second phase difference distinction signal;
   a pull-down section configured to pull down the voltage level of the first node in response to the second phase difference distinction signal; and
   a latch section configured to latch and drive the voltage of the first node to output the locking state signal.

4. A DLL circuit, comprising:
   a phase detecting block configured to compare and detect phases of a reference clock signal and a feedback clock signal to generate a phase detection signal;
   a locking state detector configured to enable a locking state signal when the phase difference between the reference clock signal and the feedback clock signal is below a first phase difference range, and to disable the locking state signal only when the phase difference between the reference clock signal and the feedback clock signal exceeds a second phase difference range that is wider than the first phase difference range;
   a delay controlling block configured to generate a delay control signal in response to the phase detection signal and the locking state signal; and
   a delay line configured to delay the reference clock signal in response to the delay control signal to generate a delay clock signal.

5. The DLL circuit of claim 4, wherein the locking state detector includes:
   a phase comparing unit configured to compare the phases of the reference clock signal and the feedback clock signal to generate a first phase difference distinction signal distinguishing the first phase difference range and a second phase difference distinction signal distinguishing the second phase difference range; and
   a locking state setting unit configured to generate a locking state signal in response to the first phase difference distinction signal and the second phase difference distinction signal.

6. The DLL circuit of claim 5, wherein the phase comparing unit includes:
   a first discriminating section configured to discriminate whether the phase difference between the reference clock signal and the feedback clock signal is below the first phase difference range to generate the first phase difference distinction signal; and
   a second discriminating section configured to discriminate whether the phase difference between the reference clock signal and the feedback clock signal is below the second phase difference range to generate the second phase difference distinction signal.

7. The DLL circuit of claim 5, wherein the locking state setting unit is configured to enable the locking state signal when the first phase difference distinction signal and the second phase difference distinction signal are enabled.

8. The DLL circuit of claim 7, wherein, with the second phase difference distinction signal enabled, the locking state setting unit enables the locking state signal to maintain the enabled state of the locking state signal even when the first phase difference distinction signal is disabled.

9. The locking state detector of claim 8, wherein the locking state setting unit includes:
   a first node;
   a pull-up section configured to pull up a voltage level of the first node in response to the first phase difference distinction signal and the second phase difference distinction signal;

a pull-down section configured to pull down the voltage level of the first node in response to the second phase difference distinction signal; and a latch section configured to latch and drive the voltage of the first node to output the locking state signal.

10. The DLL circuit of claim 4, wherein when the locking state signal is enabled, the delay controlling block is configured to lock the logical value of the delay control signal by a plurality of digital signals.

11. The DLL circuit of claim 4, further comprising a delay compensating block configured to apply to the delay clock signal to generate a feedback clock signal.

12. The DLL circuit of claim 11, wherein the delay time period is obtained by modeling the delayed amount presented in the output path of the delay clock signal.

* * * * *